US012691759B2

(12) United States Patent
Jeon

(10) Patent No.: US 12,691,759 B2
(45) Date of Patent: Jul. 28, 2026

(54) HAPTIC DISPLAY FOR VEHICLE

(71) Applicant: HYUNDAI MOBIS CO., LTD., Seoul (KR)

(72) Inventor: Sung Bae Jeon, Yongin-si (KR)

(73) Assignee: HYUNDAI MOBIS CO., LTD., Seoul (KR)

( * ) Notice: Subject to any disclaimer, the term of this patent is extended or adjusted under 35 U.S.C. 154(b) by 226 days.

(21) Appl. No.: 18/623,213

(22) Filed: Apr. 1, 2024

(65) Prior Publication Data

US 2025/0026202 A1 Jan. 23, 2025

(30) Foreign Application Priority Data

Jul. 21, 2023 (KR) ........................ 10-2023-0095347

(51) Int. Cl.
| | |
|---|---|
| *B60K 35/50* | (2024.01) |
| *B60R 11/00* | (2006.01) |
| *B60R 11/02* | (2006.01) |
| *F16F 15/08* | (2006.01) |
| *G06F 3/01* | (2006.01) |
| *H05K 5/00* | (2025.01) |
| *H05K 5/02* | (2006.01) |
| *H05K 5/03* | (2006.01) |

(52) U.S. Cl.
CPC .............. *B60K 35/50* (2024.01); *B60R 11/02* (2013.01); *F16F 15/08* (2013.01); *G06F 3/016* (2013.01); *H05K 5/0018* (2022.08); *H05K 5/0217* (2013.01); *H05K 5/03* (2013.01); *B60K 2360/40* (2024.01); *B60R 2011/005* (2013.01); *F16F 2226/042* (2013.01); *F16F 2230/0005* (2013.01)

(58) Field of Classification Search
CPC .. B60K 35/50; B60K 2360/40; H05K 5/0018; H05K 5/0217; H05K 5/03; B60R 11/02; B60R 2011/005; F16F 15/08; F16F 2226/042; F16F 2230/0005; G06F 3/016
USPC ........................................................ 361/807
See application file for complete search history.

(56) References Cited

U.S. PATENT DOCUMENTS

2013/0342484 A1* 12/2013 Bae ........................ G06F 1/1656
345/173
2016/0297376 A1* 10/2016 Chen ...................... F16M 13/02

FOREIGN PATENT DOCUMENTS

DE 202023103404 U1 * 6/2023 ............. G06F 3/016
KR 101881252 B1 8/2018

* cited by examiner

*Primary Examiner* — Imani N Hayman
*Assistant Examiner* — Ross Terry Mularski
(74) *Attorney, Agent, or Firm* — NovoTechIP International PLLC

(57) ABSTRACT

A haptic display for a vehicle includes a display panel, a front cover having a front surface to which the display panel is attached, an oscillation actuator attached to the display panel, a main bracket disposed in rear of the front cover and spaced apart from the oscillation actuator and the front cover, a forward/backward vibration damper installed to enable the front cover to be supported by the main bracket in order to dampen vibration between the front cover and the main bracket, an upward/downward vibration damper installed to enable the front cover to be supported by the main bracket in a upward/downward direction in order to dampen vibration between the front cover and the main bracket, and a rear cover fixed to the main bracket while surrounding the main bracket in rear of the front cover.

8 Claims, 9 Drawing Sheets

FIG. 2

HAPTIC DISPLAY FOR VEHICLE

CROSS-REFERENCE TO RELATED APPLICATIONS

This application claims priority from Korean Patent Application No. 10-2023-0095347 filed on Jul. 21, 2023, in the Korean Intellectual Property Office, the disclosure of which is incorporated herein by reference in its entirety.

TECHNICAL FIELD

The present invention relates to technology relevant to a structure of a haptic display for a vehicle.

BACKGROUND

A haptic display provides more accurate and convenient operability to the user by not only visually providing a variety of information needed to the user, but also providing appropriate feedback of a touch operation of the user through vibration.

Such a haptic display generates vibration in response to a touch operation of the user. However, it is preferred that, if possible, the vibration be transmitted only to a display panel without being transmitted to parts surrounding the display panel or fixing the display panel.

The above matters disclosed in this section are merely for enhancement of understanding of the general background of the invention and should not be taken as an acknowledgement or any form of suggestion that the matters form the related art already known to a person skilled in the art.

SUMMARY

Therefore, the present invention has been made in view of the above problems, and it is an object of the present invention to provide a haptic display for a vehicle which is configured to allow vibration generated in an oscillation actuator to be transmitted only to a display panel while preventing the vibration from being transmitted to parts surrounding or supporting the display panel, if possible, thereby being capable of achieving an enhancement in responsiveness of the display panel and an enhancement in assemblability.

In accordance with the present invention, the above and other objects can be accomplished by the provision of a haptic display for a vehicle including a display panel, a front cover having a front surface to which the display panel is attached, an oscillation actuator attached to the display panel, a main bracket positioned behind the front cover and spaced apart from the oscillation actuator and the front cover, a forward/backward vibration damper installed between the front cover and the main bracket to dampen vibration between the front cover and the main bracket in the forward/backward direction, an upward/downward vibration damper installed between the front cover and the main bracket to dampen vibration between the front cover and the main bracket in the upward/downward direction, and a rear cover fixed to the main bracket to surround the main bracket in rear of the front cover.

The forward/rearward vibration damper may include a fixing portion attached to the main bracket, a damping portion that forms a layer made of only a vibration insulator material between the fixing portion and the front cover, and a bonding portion or material configured to bond the damping portion to the front cover.

A plurality of damping slits may be formed through the main bracket such that the damping slits overlap one another in a radial direction about a portion of the main bracket to which the fixing portion of the forward/rearward vibration damper is attached.

A damper fixing groove may be formed in the main bracket to receive the fixing portion of the forward/rearward vibration damper. A rotation preventing protrusion may be formed in the damper fixing groove to limit relative rotation of the fixing portion of the forward/rearward vibration damper. The fixing portion of the forward/rearward vibration damper may be formed with a female thread to be threadedly coupled with an assembling screw extending through the main bracket at a rear side of the main bracket.

The upward/downward vibration damper may include a floating member including a lower flange formed of a vibration insulator material, the lower flange including an upper surface on which the front cover is supported, and an upper flange having a lower surface via which the floating member is supported on the main bracket at a lower surface thereof.

A cover protrusion may be formed on the front cover, and may protrude rearwardly to be seated on the upper surface of the lower flange of the floating member. An upward/downward movement guide groove may be formed in the main bracket such that only a lower surface of the upper flange of the floating member is supported by the upward/downward movement guide groove while contacting the upward/downward movement guide groove. The cover protrusion and the floating member may be inserted into the upward/downward movement guide groove while being spaced apart from the main bracket to be allowed to vibrate upwards and downwards in the upward/downward movement guide.

A support protrusion protruding in a forward/rearward direction may be integrally formed on the main bracket which widens the surface which contacts the lower surface of the upper flange in order to more stably support the lower surface of the upper flange of the floating member.

The rear cover may be fixed to the main bracket in a state of being spaced apart from the front cover.

A first forward/rearward restraint protrusion and a second forward/rearward restraint protrusion may be integrally formed in a pair at the rear cover and the main bracket, respectively, such that the first forward/rearward restraint protrusion and the second forward/rearward restraint protrusion are inserted into each other in accordance with upward/downward displacements thereof, thereby restraining relative forward/rearward movement of the rear cover and the main bracket. A linear contact protrusion may be integrally formed at one of the first forward/rearward restraint protrusion and the second forward/rearward restraint protrusion to form a linear contact state together with another one of the first forward/rearward restraint protrusion and the second forward/rearward restraint protrusion.

A first parallel-direction restraint protrusion and a second parallel-direction restraint protrusion may be integrally formed in a pair at the rear cover and the main bracket, respectively, to restrain relative movement of the rear cover and the main bracket in directions parallel to the display panel. The first parallel-direction restraint protrusion may include a guide portion widely opened downwards, and an outer arc-shaped restraint portion connected to the guide portion and configured to confine the second parallel-direction restraint protrusion received therein through the guide portion. The second parallel-direction restraint protrusion may include an inner arc-shaped restraint portion configured to be inserted into the outer arc-shaped restraint portion through the guide portion of the first parallel-direction restraint protrusion. A plurality of linear contact protrusions may be integrally formed at the inner arc-shaped restraint portion in order to form a linear contact state together with the outer arc-shaped restraint portion.

BRIEF DESCRIPTION OF THE DRAWINGS

The above and other objects, features and other advantages of the present invention will be more clearly understood from the following detailed description taken in conjunction with the accompanying drawings, in which:

Figure 2:
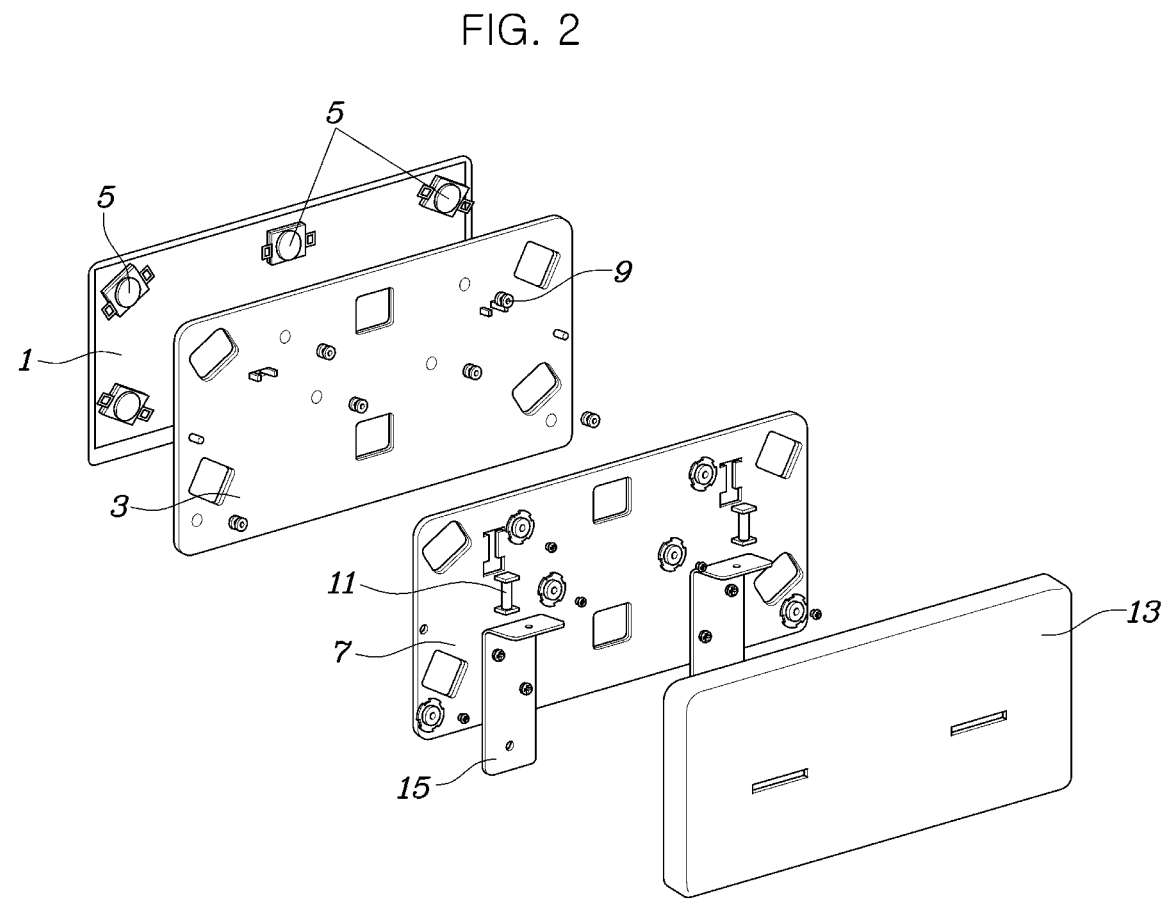

FIG. 2 is an exploded perspective view showing the haptic display of FIG. 1;

DETAILED DESCRIPTION

Figure 1:
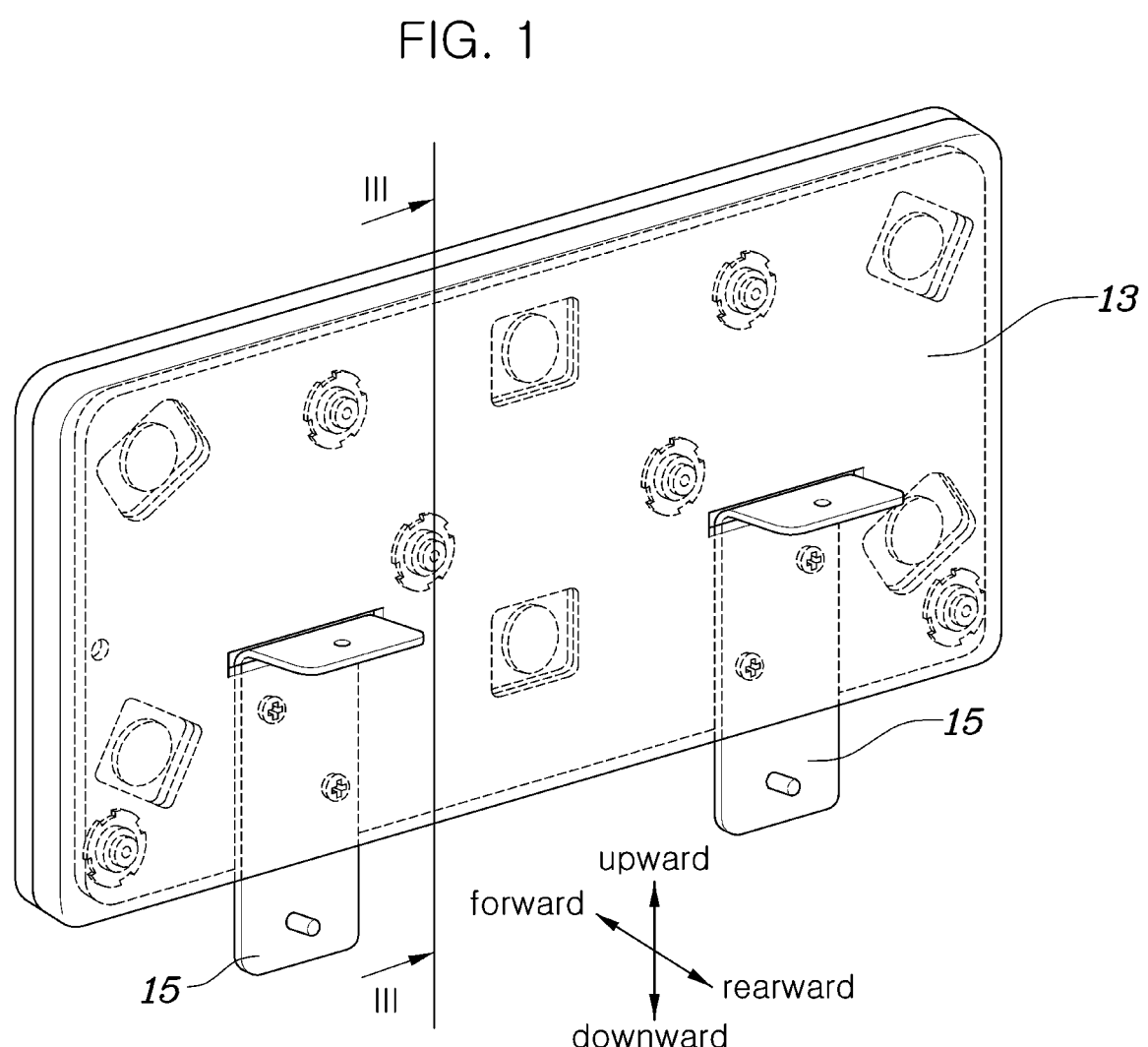
FIG. 1 is a rear perspective view of a haptic display for a vehicle according to an embodiment of the present invention.

Hereinafter, embodiments of the present invention will be described in detail with reference to the accompanying drawings, and the same or similar elements are designated by the same reference numerals regardless of the numerals in the drawings and redundant description thereof will be omitted.

The suffixes "module" and "unit" of elements herein are used for convenience of description and thus can be used interchangeably and do not have any distinguishable meanings or functions.

In the following description of the embodiments of the present invention, a detailed description of known functions and configurations incorporated herein will be omitted when it may obscure the subject matter of the embodiments of the present invention. In addition, the embodiments of the present invention will be more clearly understood from the accompanying drawings and should not be limited by the accompanying drawings, and it is to be appreciated that all changes, equivalents, and substitutes that do not depart from the spirit and technical scope of the present invention are encompassed in the present invention.

It will be understood that, although the terms "first," "second," etc. may be used herein to describe various elements, these elements should not be limited by these terms. These terms are only used to distinguish one element from another.

In the case where an element is "connected" or "linked" to another element, it should be understood that the element may be directly connected or linked to the other element, or another element may be present therebetween. Conversely, in the case where an element is "directly connected" or "directly linked" to another element, it should be understood that no other element is present therebetween.

Unless clearly used otherwise, singular expressions include a plural meaning.

In this specification, the term "comprising," "including," or the like, is intended to express the existence of the characteristic, the numeral, the step, the operation, the element, the part, or the combination thereof, and does not exclude another characteristic, numeral, step, operation, element, part, or any combination thereof, or any addition thereto.

Referring to FIGS. 1 to 5, a haptic display for a vehicle according to an embodiment of the present invention is configured through inclusion of a front cover 3 configured to fix a display panel 1 to a front surface thereof, an oscillation actuator 5 fixed to the display panel 1, a main bracket 7 disposed in rear of the front cover 3 while being spaced apart from the oscillation actuator 5 and the front cover 3, a forward/backward vibration damper 9 installed to enable the front cover 3 to be supported by the main bracket 7 in a forward/rearward direction in order to dampen vibration between the front cover 3 and the main bracket 7, an upward/downward vibration damper 11 installed to enable the front cover 3 to be supported by the main bracket 7 in an upward/downward direction in order to dampen vibration between the front cover 3 and the main bracket 7, and a rear cover 13 fixed to the main bracket 7 to surround the main bracket 7 in rear of the front cover 3.

The main bracket 7 is fixed to a vehicle body or the like by an auxiliary bracket 15 shown in the drawings.

That is, the haptic display according to the embodiment of the present invention has a configuration wherein the front cover 3, to which the display panel 1 is fixed, is supported by the main bracket 7 in a state of being dampened from vibration by the forward/backward vibration damper 9 and the upward/downward vibration damper 11.

Accordingly, vibration generated from the oscillation actuator 5, for implementation of a haptic function, may be effectively transmitted to the front cover 3 and the display panel 1 and, as such, responsiveness to manipulation of the user may be greatly enhanced. However, the vibration may be damped or blocked without being transmitted to the main bracket 7 by the forward/rearward vibration damper 9 and the upward/downward vibration damper 11 and, as such, unnecessary vibration and noise of parts around the display panel 1 may be reduced or prevented.

For reference, the oscillation actuator 5 is coupled to a rear side of the display panel 1 in a close contact state. The front cover 3 is perforated in a region in which the oscillation actuator 5 is installed. Accordingly, the front cover 3 is prevented from directly contacting the oscillation actuator 5.

Figure 3:
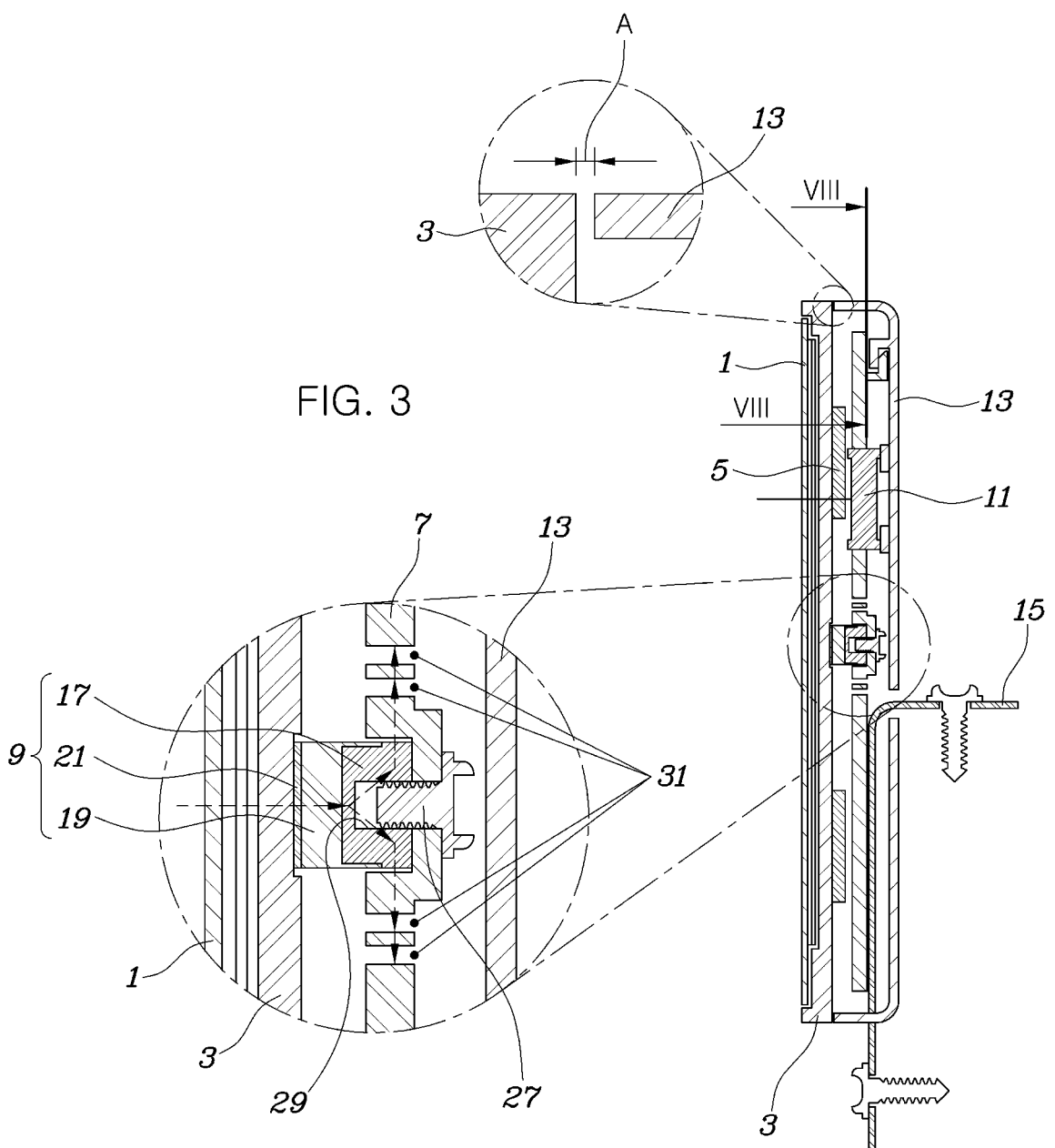
FIG. 3 is a cross-sectional view taken along line III-III in FIG. 1.
Figure 4:
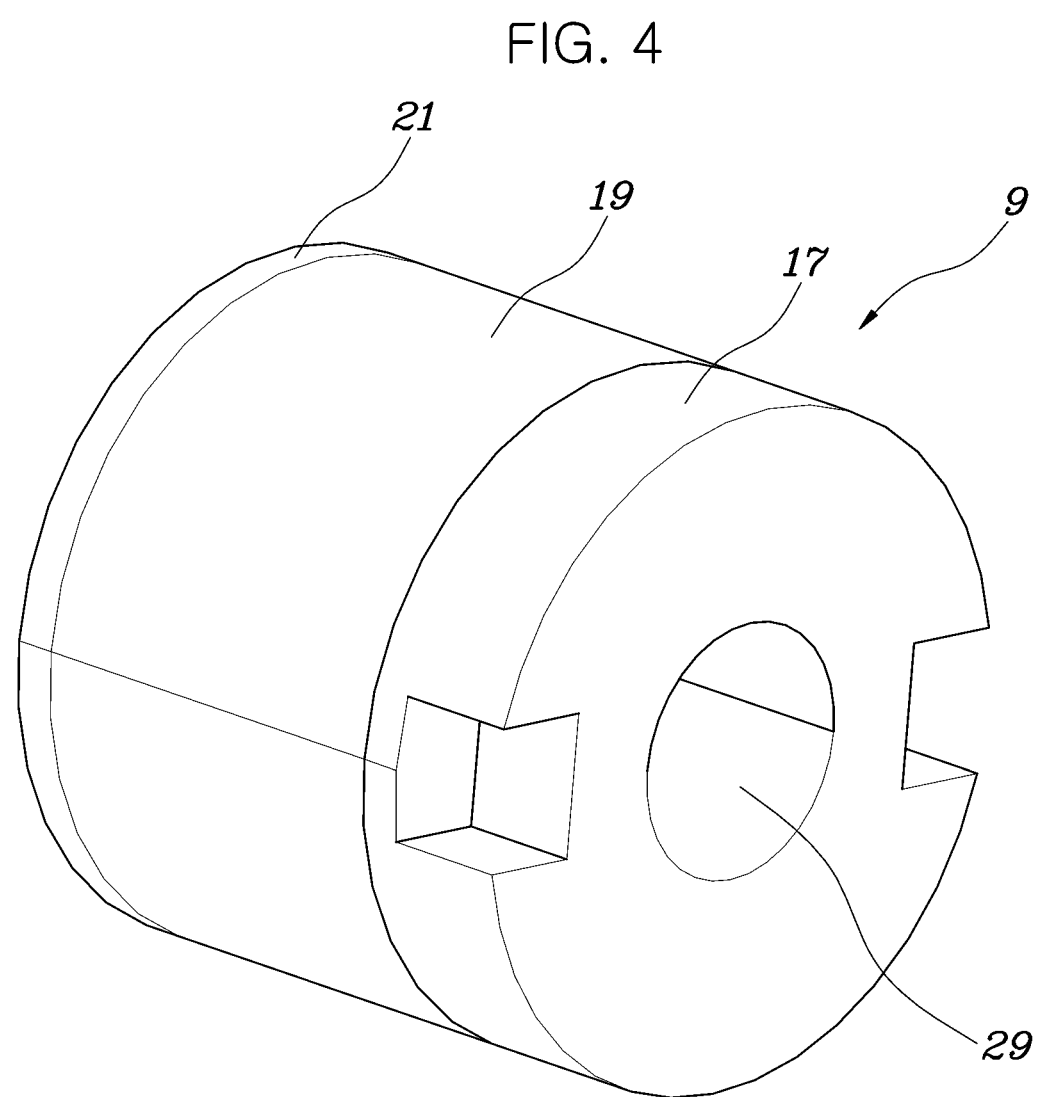
FIG. 4 is a perspective view showing a forward/rearward vibration damper of FIG. 3.
Figure 5:
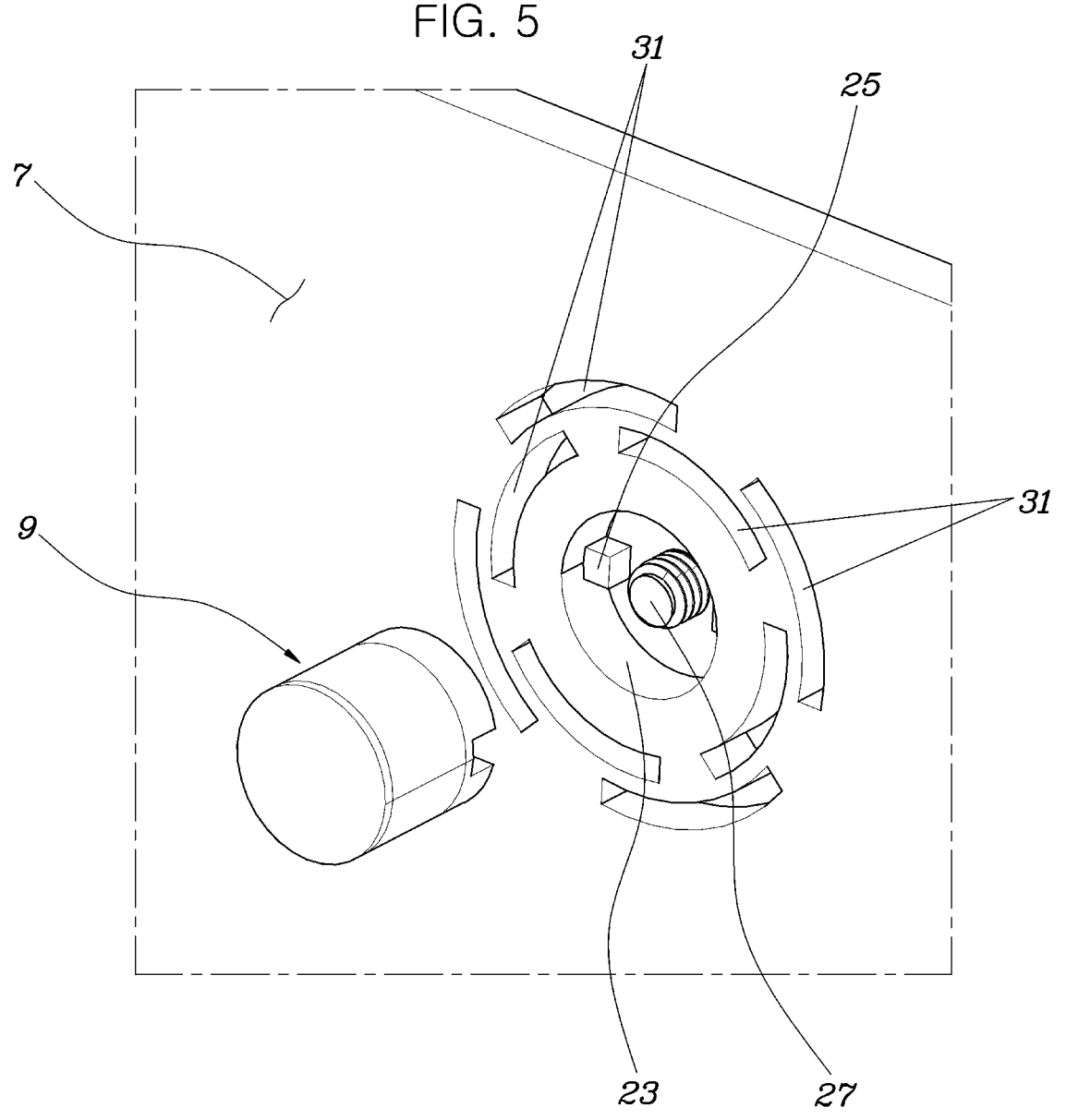
FIG. 5 is a perspective view showing a structure in which the forward/rearward vibration damper is coupled to a main bracket.

As shown in FIGS. 3 to 5 in detail, the forward/rearward vibration damper 9 is configured through inclusion of a fixing portion 17 fixed to the main bracket 7, a damping portion 19 integrally formed at the fixing portion 17 to form a layer made of only a vibration insulator between the fixing portion 17 and the front cover 3, and a bonding portion 21 configured to bond the damping portion 19 to the front cover 3.

The fixing portion 17 may be made of a metal material such as steel or the like. The damping portion 19 may be made of a vibration insulator such as rubber or the like.

In addition, the bonding portion 21 may be constituted by a double-sided tape or the like bonded to a front surface of the damping portion 19 or may be constituted by an adhesive or the like coated on the front surface of the damping portion 19.

That is, in accordance with an embodiment of the present invention, the forward/rearward vibration damper 9 may be configured by forming, through insert injection molding or the like, the damping portion 19 made of a vibration insulator such as rubber or the like at the fixing portion 17 made of a metal material, and forming the bonding portion 21 at a front side of the damping portion 19 through coating of an adhesive, bonding of a double-sided tape, or the like.

Meanwhile, a damper fixing groove 23, into which the fixing portion 17 of the forward/rearward vibration damper 9 is inserted, is formed at the main bracket 7. A rotation preventing protrusion 25 is formed at the damper fixing groove 23 to limit relative rotation of the fixing portion 17 of the forward/rearward vibration damper 9. The fixing portion 17 of the forward/rearward vibration damper 9 is formed with a female thread 29 to be threadedly coupled with an assembling screw 27 extending through the main bracket 7 at a rear side of the main bracket 7.

Accordingly, when the assembling screw 27 is assembled in a state in which the fixing portion 17 of the forward/rearward vibration damper 9 is inserted into the damper fixing groove 23 of the main bracket 7, relative rotation of the forward/rearward vibration damper 9 is naturally prevented by the rotation prevention protrusion 25 and, as such, excellent assemblability of the assembling screw 27 is secured.

In addition, coupling between the front cover 3 and the forward/rearward vibration damper 9 may be very easily and rapidly carried out using the bonding portion 21 of the forward/rearward vibration damper 9 and, as such, an effect of enhancing assemblability of the haptic display according to the embodiment of the present invention may be obtained.

Since the forward/rearward vibration damper 9 installed between the front cover 3 and the main bracket 7 is in a state of forming a layer completely insulating the front cover 3 and the main bracket 7 from each other, as described above, vibration transmitted from the oscillation actuator 5 via the display panel 1 and the front cover 3 is attenuated at the damping portion 19 of the forward/rearward vibration damper 9 and, as such, most thereof is not transmitted to the fixing portion 17 of the forward/rearward vibration damper 9 and the main bracket 7.

In addition, vibration primarily attenuated through the damping portion 19 is transmitted to the main bracket 7 after being secondarily attenuated at the fixing portion 17 made of a metal material or the like.

In addition, a plurality of damping slits 31 is formed through the main bracket 7 such that the damping slits 31 overlap one another in a radial direction about a portion of the main bracket 7 to which the fixing portion 17 of the forward/rearward vibration damper 9 is fixed.

Accordingly, although there may be vibration transmitted via the forward/rearward vibration damper 9, even the vibration is attenuated by the damping slits 31 and, as such, is effectively prevented from propagating to other portions of the main bracket 7.

For reference, FIG. 3 indicates, by an arrow, a path along which vibration is transmitted from the display panel 1 via the forward/rearward vibration damper 9.

Figure 6:
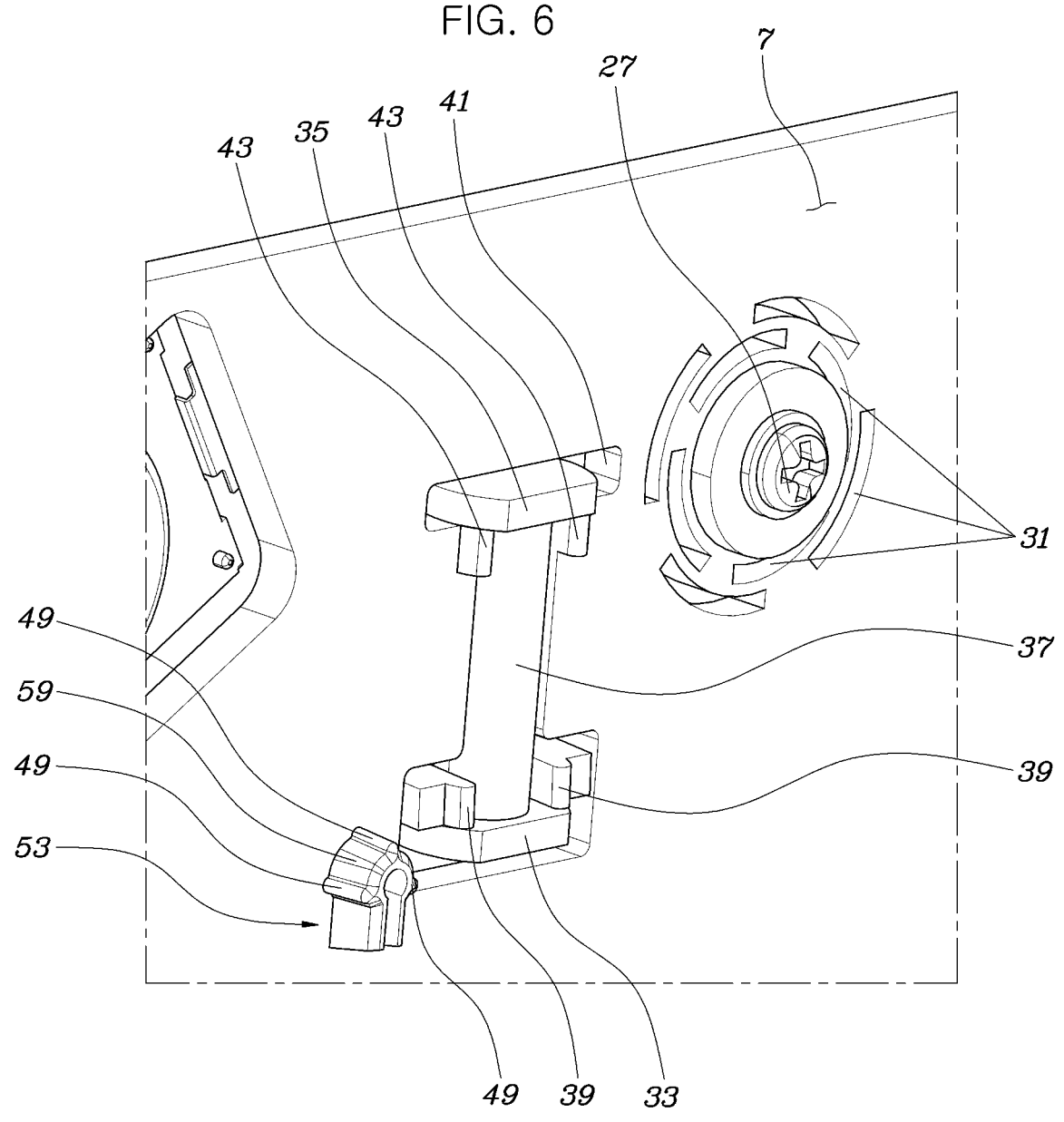
FIG. 6 is perspective view showing a structure for installation of an upward/downward vibration damper, observed at a rear side of the main bracket.

Meanwhile, as shown in FIG. 6, the upward/downward vibration damper 11 is configured through inclusion of a floating member 37 including a lower flange 33 formed of a vibration insulator such as rubber or the like and configured to support a weight of the front cover 3 by an upper surface thereof, and an upper flange 35 disposed over the lower flange 33 while being connected to the lower flange 33 and supported by the main bracket 7 at a lower surface thereof.

That is, the floating member 37 has a configuration in which the upper flange 35 and the lower flange 33 are vertically connected to each other, the upper flange 35 is supported by the main bracket 7 at a lower surface thereof, and the lower flange 33 supports the front cover 3. As a result, the front cover 3 has a structure vertically hung on the main bracket 7 via the floating member 37. Accordingly, vibration transmitted from the front cover 3 is dampened by the floating member 37 and, as such, most thereof is not transmitted to the main bracket 7.

A cover protrusion 39 is integrally formed at the front cover 3. The cover protrusion 39 protrudes rearwards and is seated on an upper surface of the lower flange 33 of the floating member 37. An upward/downward movement guide groove 41 is formed at the main bracket 7 such that only the lower surface of the upper flange 35 of the floating member 37 is supported by the upward/downward movement guide groove 41 while contacting the upward/downward movement guide groove 41. The cover protrusion 39 and the floating member 37 are inserted into the upward/downward movement guide groove 41 while being spaced apart from the main bracket 7 such that the cover protrusion 39 and the floating member 37 may vibrate upwards and downwards in the upward/downward movement guide 41.

Accordingly, the floating member 37 and the cover protrusion 39 of the front cover 3 prevent vibration transmitted from the front cover 3 from being directly transmitted to the main bracket 7, by virtue of the upward/downward movement guide groove 41. The vibration is transmitted to the main bracket 7 via only the upper flange 35 of the floating member 37 after being attenuated by the floating member 37. Since the floating member 37 is made of a vibration insulator such as rubber, vibration transmitted to the main bracket 7 after passing through the floating member 37 is substantially little.

Figure 7:
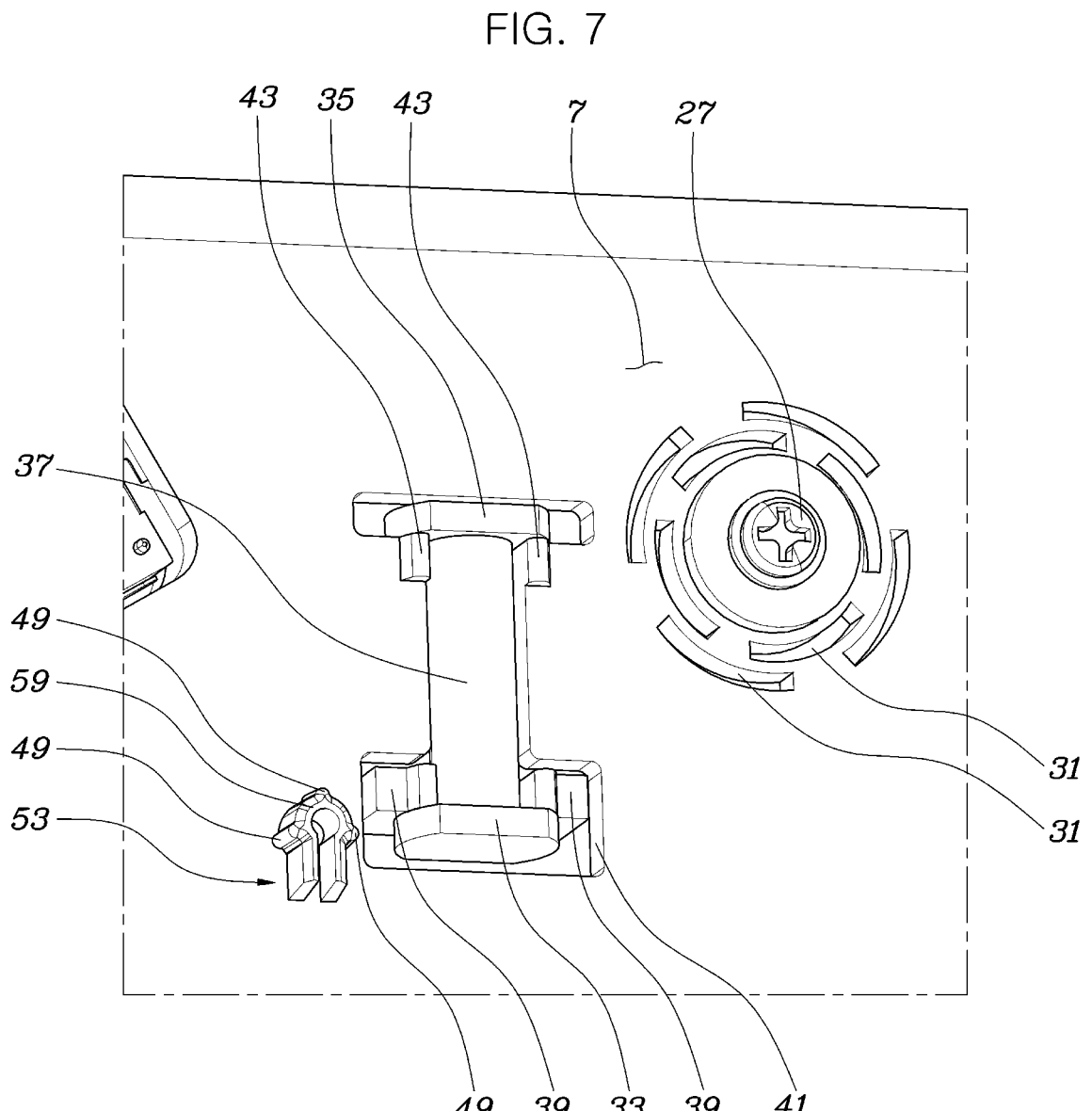
FIG. 7 is a perspective view showing a state of FIG. 6 observed at a lower side.

Meanwhile, as shown in FIGS. 6 and 7, a support protrusion 43 protruding in a forward/rearward direction may be integrally formed at the main bracket 7 in order to more stably support the lower surface of the upper flange 35 of the floating member 37.

Referring to FIG. 3, the rear cover 13 is fixed to the main bracket 7 in a state of being spaced apart from the front cover 3.

For reference, the distance, by which the rear cover 13 and the front cover 3 are spaced apart from each other, is indicated by "A".

Accordingly, although vibration generated from the oscillation actuator 5 is transmitted to the front cover 3 via the display panel 1, transmission of the vibration from the front cover 3 to the rear cover 13 is structurally prevented.

Meanwhile, a first forward/rearward restraint protrusion 45 and a second forward/rearward restraint protrusion 47 are integrally formed in a pair at the rear cover 13 and the main bracket 7, respectively, such that the first forward/rearward restraint protrusion 45 and the second forward/rearward restraint protrusion 47 are inserted into each other in accordance with upward/downward displacements thereof, thereby restraining relative forward/rearward movement of the rear cover 13 and the main bracket 7.

A linear contact protrusion 49 is integrally formed at one of the first forward/rearward restraint protrusion 45 and the second forward/rearward restraint protrusion 47 to form a linear contact state together with the other of the first forward/rearward restraint protrusion 45 and the second forward/rearward restraint protrusion 47.

Accordingly, when the first forward/rearward restraint protrusion 45 and the second forward/rearward restraint protrusion 47 are engaged with each other as the rear cover 13 is moved downwards with respect to the main bracket 7, the first forward/rearward restraint protrusion 45 and the second forward/rearward restraint protrusion 47 may exert forward/rearward restraint force while minimizing contact between the rear cover 13 and the main bracket 7 by the linear contact protrusion 49.

In addition, a first parallel-direction restraint protrusion 51 and a second parallel-direction restraint protrusion 53 are integrally formed in a pair at the rear cover 13 and the main bracket 7, respectively, to restrain relative movement of the rear cover 13 and the main bracket 7 in directions parallel to the display panel 1.

The first parallel-direction restraint protrusion 51 is formed through connection between a guide portion 55 widely opened downwards and an outer arc-shaped restraint portion 57 configured to confine the second parallel-direction restraint protrusion 53 received therein through the guide portion 55.

The second parallel-direction restraint protrusion 53 includes an inner arc-shaped restraint portion 59 configured to be inserted into the outer arc-shaped restraint portion 57 through the guide portion 55 of the first parallel-direction restraint protrusion 51. A plurality of linear contact protrusions 49 is integrally formed at the inner arc-shaped restraint portion 59 in order to form a linear contact state together with the outer arc-shaped restraint portion 57.

Accordingly, when the first forward/rearward restraint protrusion 45 and the second forward/rearward restraint protrusion 47 are engaged with each other as the rear cover 13 is moved downwards with respect to the main bracket 7, the inner arc-shaped restraint portion 59 of the second parallel-direction restraint protrusion 53 is inserted into the guide portion 55 and the outer arc-shaped restraint portion 57 of the first parallel-direction restraint protrusion 51 and, as such, the linear contact protrusions 49 of the inner arc-shaped restraint portion 59 may generate parallel-direction restraint force between the rear cover 13 and the main bracket 7 while minimizing contact thereof with respect to the outer arc-shaped restraint portion 57.

For reference, the first parallel-direction restraint protrusion 51 and the second parallel-direction restraint protrusion 53 are coupled to each other while being elastically deformed.

Here, "parallel direction" may be understood as a direction parallel to a virtual movement plane formed when the rear cover 13 is moved downwards with respect to the main bracket 7 such that the first forward/rearward restraint protrusion 45 and the second forward/rearward restraint protrusion 47 are engaged with each other.

Figure 8:
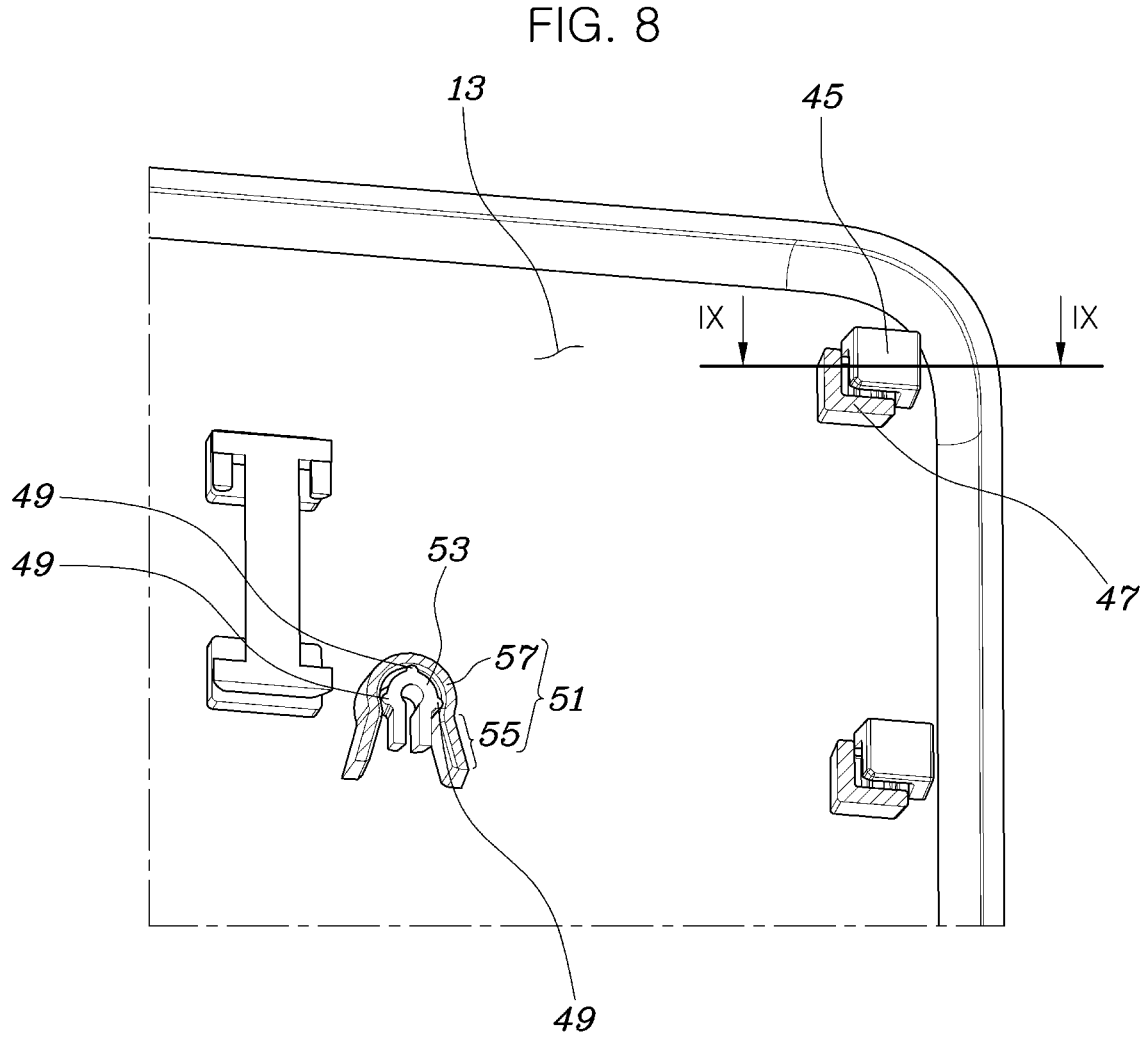
FIG. 8 is a cross-sectional view taken along line VIII-VIII in FIG. 3.
Figure 9:
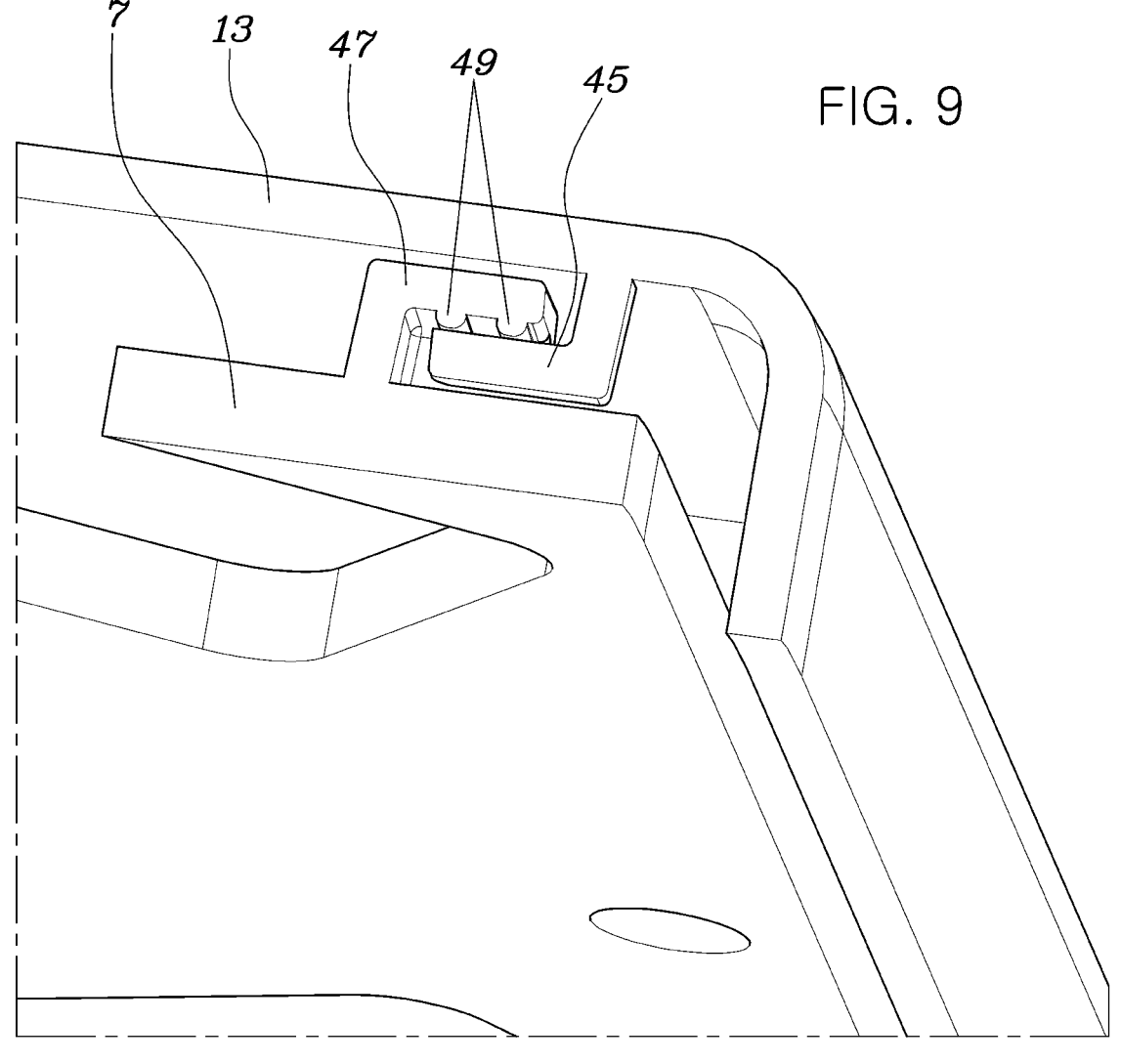
FIG. 9 is a cross-sectional view taken along line IX-IX in FIG. 8.

In addition, as shown in FIG. 8, the linear contact protrusion 49 of the inner arc-shaped restraint portion 59 is formed at an upper side and opposite lateral sides of the inner arc-shaped restraint portion 59, and the outer arc-shaped restraint portion 57 coupled to the inner arc-shaped restraint portion 59 through elastic deformation of a low side thereof elastically supports the inner arc-shaped restraint portion 59. Accordingly, relative movement of the inner arc-shaped restraint portion 59 in all directions on the virtual movement plane is restrained by the outer arc-shaped restraint portion 57.

As a result, the rear cover 13 is in a state of being completely restrained in all three-dimensional directions with respect to the main bracket 7, but an area where the rear cover 13 contacts the main bracket 7 for restraint therebetween is very small. Accordingly, vibration insulation between the rear cover 13 and the main bracket 7 is structurally secured.

As apparent from the above description, in accordance with the present invention, it may be possible to allow vibration generated in an oscillation actuator to be transmitted only to a display panel while preventing the vibration from being transmitted to parts surrounding or supporting the display panel, if possible, thereby achieving an enhancement in responsiveness of the display panel and an enhancement in assemblability.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A haptic display for a vehicle comprising:

a front cover having a front surface;

a display panel attached to the front surface;

an oscillation actuator attached to the display panel;

a main bracket positioned behind the front cover and spaced apart from the oscillation actuator and the front cover;

a forward/backward vibration damper installed between the main bracket and the front cover to dampen vibrations between the front cover and the main bracket in a forward/backward direction;

an upward/downward vibration damper installed between the main bracket and the front cover to dampen vibrations between the front cover and the main bracket in an upward/downward direction; and a rear cover fixed to the main bracket and configured to surround the main bracket behind the front cover, wherein the forward/backward vibration damper comprises:

a fixing portion attached to the main bracket;

a damping portion integrally formed with the fixing portion, the damping portion being positioned between the fixing portion and the front cover and comprising a layer made only of a vibration insulator material; and a bonding material configured to bond the damping portion to the front cover, and wherein a plurality of damping slits is formed in the main bracket that overlap one another in a radial direction about a portion of the main bracket to which the fixing portion of the forward/backward vibration damper is attached.

2. The haptic display according to claim 1, wherein:

the main bracket includes a damper fixing groove configured to receive the fixing portion of the forward/backward vibration damper;

the damping fixing groove includes a rotation preventing protrusion configured to limit rotation of the fixing portion of the forward/backward vibration damper with respect to the main bracket; and the fixing portion of the forward/backward vibration damper includes a female thread configured to be threadedly coupled with an assembling screw extending through the main bracket at a rear side of the main bracket.

3. A haptic display for a vehicle comprising:

a front cover having a front surface;

a display panel attached to the front surface;

an oscillation actuator attached to the display panel;

a main bracket positioned behind the front cover and spaced apart from the oscillation actuator and the front cover;

a forward/backward vibration damper installed between the main bracket and the front cover to dampen vibrations between the front cover and the main bracket in a forward/backward direction;

an upward/downward vibration damper installed between the main bracket and the front cover to dampen vibrations between the front cover and the main bracket in an upward/downward direction; and a rear cover fixed to the main bracket and configured to surround the main bracket behind the front cover, wherein the upward/downward vibration damper comprises a floating member having a lower flange formed of a vibration insulator material and having an upper surface on which the front cover is supported, and an upper flange having a lower surface via supported on the main bracket.

4. The haptic display according to claim 3, wherein:

the front cover includes a cover protrusion that protrudes rearwardly from the front cover and is seated on an upper surface of the lower flange of the floating member; and the main bracket includes an upward/downward movement guide groove in which the floating member is positioned and through which the cover protrusion extends to be seated on the upper surface of the lower flange, the upward/downward guide groove and the floating member cooperating such that only the lower surface of the upper flange is supported by the main bracket; and the cover protrusion and portions of the floating member other than the lower surface of the upper flange are spaced apart from the main bracket.

5. The haptic display according to claim 4, wherein the main bracket includes a support protrusion that widens a surface of main bracket on which the lower surface of the upper flange of the floating member is supported.

6. The haptic display according to claim 1, wherein the rear cover is spaced apart from the front cover when attached to the main bracket.

7. The haptic display according to claim 6, wherein:

the rear cover includes a first forward/rearward restraint protrusion and the main bracket includes a second forward/rearward restraint protrusion which cooperate to restrain forward/rearward movement of the rear cover and the main bracket with respect to each other; and one of the first forward/rearward restraint protrusion and the second forward/rearward restraint protrusion includes at least one linear contact protrusion to form a linear contact state together with the other one of the first forward/rearward restraint protrusion and the second forward/rearward restraint protrusion.

8. A haptic display for a vehicle comprising:

a front cover having a front surface;

a display panel attached to the front surface;

an oscillation actuator attached to the display panel;

a main bracket positioned behind the front cover and spaced apart from the oscillation actuator and the front cover;

a forward/backward vibration damper installed between the main bracket and the front cover to dampen vibrations between the front cover and the main bracket in a forward/backward direction;

an upward/downward vibration damper installed between the main bracket and the front cover to dampen vibrations between the front cover and the main bracket in an upward/downward direction; and a rear cover fixed to the main bracket and configured to surround the main bracket behind the front cover, wherein the rear cover is spaced apart from the front cover when attached to the main bracket, and wherein:

the rear cover includes a first parallel-direction restraint protrusion and the main bracket includes a second parallel-direction restraint protrusion which cooperate to restrain movement of the rear cover and the main bracket with respect to each other in directions parallel to the display panel;

the first parallel-direction restraint protrusion comprises an outer arc-shaped restraint portion configured to receive and confine the second parallel-direction restraint protrusion and a guide portion that extends downwardly from the restraint portion and is configured to guide the second parallel-direction restraint protrusion into the guide portion;

the second parallel-direction restraint protrusion comprises an inner arc-shaped restraint portion configured to be received in the outer arc-shaped restraint portion; and the inner arc-shaped restraint portion includes a plurality of linear contact protrusions configured to form a linear contact state together with the outer arc-shaped restraint portion.

* * * * *